United States Patent [19]
Evans et al.

[11] Patent Number: 6,002,279
[45] Date of Patent: Dec. 14, 1999

[54] CLOCK RECOVERY CIRCUIT

[75] Inventors: William P. Evans, Catonsville; Eric Naviasky, Ellicott City; Patrick Farrell, Baltimore; Anthony Caviglia, Marriotsville; John Ebner; Hugh Thompson, both of Baltimore; Hao Tang, Silver Spring, all of Md.

[73] Assignee: G2 Networks, Inc., Los Gatos, Calif.

[21] Appl. No.: 08/957,694

[22] Filed: Oct. 24, 1997

[51] Int. Cl.⁶ .................................................. H03L 7/00
[52] U.S. Cl. ................................. 327/144; 327/163
[58] Field of Search ........................... 327/141, 144–148, 327/150, 152, 155–157, 159, 163, 232, 238, 243, 254, 291, 293, 548; 331/17; 375/373, 375, 376

[56] References Cited

U.S. PATENT DOCUMENTS

| | | | |
|---|---|---|---|
| 4,373,181 | 2/1983 | Chisholm et al. | 364/200 |
| 4,684,831 | 8/1987 | Kruest | 326/78 |
| 4,787,082 | 11/1988 | Delaney et al. | 370/85 |
| 4,797,635 | 1/1989 | Hatcher | 331/17 |
| 5,382,921 | 1/1995 | Estrada et al. | 331/1 A |
| 5,448,598 | 9/1995 | Yousefi et al. | 375/376 |
| 5,485,113 | 1/1996 | Ito et al. | 327/234 |
| 5,485,490 | 1/1996 | Leung et al. | 375/371 |
| 5,533,072 | 7/1996 | Georgiou et al. | 375/371 |
| 5,548,280 | 8/1996 | Pearce | 340/825.05 |
| 5,550,860 | 8/1996 | Georgiou et al. | 375/220 |
| 5,578,939 | 11/1996 | Beers et al. | 326/30 |
| 5,587,675 | 12/1996 | Schmitt | 327/99 |
| 5,592,629 | 1/1997 | Gamble | 395/250 |
| 5,598,443 | 1/1997 | Poeppleman | 375/359 |
| 5,623,518 | 4/1997 | Pfiffner | 375/278 |
| 5,633,899 | 5/1997 | Fielder et al. | 375/376 |
| 5,638,028 | 6/1997 | Voth | 331/25 |
| 5,818,304 | 10/1998 | Hogeboom | 331/11 |
| 5,844,436 | 12/1998 | Altmann | 327/156 |

FOREIGN PATENT DOCUMENTS 0 285 413 A2  3/1987  European Pat. Off. .

OTHER PUBLICATIONS

Jurgens, C.; "Fibre Channel: A connection to the future," *Computer*, vol. 28, Aug. 1995; available at http://www.computer.org/pubs/computer/hotopics/08/hotopics.htm.

Nelson, C.; "Fiber Channel offers speed, interoperability," *Communications Design*, Part 4; available at http://techweb.cmp.com/eet/nick/comdesign/fibercha.html.

"Fiber Channel Components," *Electronics Components*, Hewlett Packard; available at http://hpcc920.external.hp.com/HP–COMP/3.0/3.3.t.5.6.html.

"Fibre Channel Products," *AMCC*, available at http://www.amcc.com/product–guide/fibrechannel/fibre.html.

"CERN Fibre Channel homepage," available at http://www.cern.ch/HSI/fcs/fcs.html.

"Fibre Channel Systems Initiative (FCSI)," Mar. 13, 1995, available at http://www.amdahl.com/ext/CARP/FCA/FC-SI.html.

"Fibre Channel Association," May 23, 1997, Available at http://amdahl.com/ext/CARP/FCA./FCA.html.

Meggyesi, Z.; "Fibre Channel Overview," available at http://www1.cern.ch/HSI/fcs/spec/overview.htm.

Shafir, H.; "Gigabit networking technologies converge," *Communications Design*, Part 4; available at http://techweb.cmp.com/ee/nick/comdesign/gigabitn.html.

(List continued on next page.)

*Primary Examiner*—My-Trang Nuton
*Attorney, Agent, or Firm*—Pillsbury Madison & Sutro LLP.

[57] ABSTRACT

A clock recovery circuit that can be used for recovering a clock signal from a data stream having a high data rate. The clock recovery circuit has a phase interpolator and non-linear digital to analog converters. These circuits are used to interpolate between the phases produced by a voltage controlled oscillator. A determination to advance or hinder a currently selected phase can be made using an up/down detector, a divider, and control logic. The divider can divide not only the up and down pulses produced by the up/down detector, but also the clock frequency. By dividing the clock frequency, the control logic can be designed using CMOS logic circuits.

31 Claims, 9 Drawing Sheets

OTHER PUBLICATIONS

Computer and Communication Standards, available at http://www.cmpcmm.com/cc/standards.html.

Fibre Channel Manufacturers, available at http://www.cern.ch/HSI/fcs/manufac/manufac.htm.

FC–0/FC–1 Chips, available at http://www.cern.ch/HSI/fcs/comps/fc0_1.htm.

VLSI Technology, Inc. Product Bulletin, Aug. 1995.

Vitesse Semiconductor Corporation, draft of "Advance Product Information VSC7120 for 1.0625 Gbit/Sec Fibre Channel Repeater Circuit," Oct. 19, 1995.

Applied Micro Circuits Corporation, Preliminary Device Specification for Fibre Channel and Gigabit Ethernet Transceiver S2053, Feb. 3, 1998.

Applied Micro Circuits Corporation, Preliminary Device Specification for Fibre Channel and Gigabit Ethernet Transceiver S2054, Feb. 3, 1998.

Gore Creative Technologies "Cooper Gigabaud Link Module FCN 7181, " Jun. 3, 1997, available at http.//222./amdahl.com/ext/CARP/FCA/products/Gore/CuGLM.htm.

Fibre Channel White Paper, available at http://www.unisys.com/marketplace/aseries/techlib/whpapers/fibchan.htm.

Global Engineering, "Fibre Channel; Physical and Signaling Interface (FC–PH)," working draft proposed American National Standard for Information Systems, Jun. 1, 1994.

2 STAGE RING OSCILLATOR

| UP | DOWN | DSEL | REG[7:0] | DAC1 [7:0] | DAC2 [7:0] | DAC3 [7:0] | DAC4 [7:0] |
|---|---|---|---|---|---|---|---|
| 1 | 0 | 00 | 00000000 | 11111111 | 00000000 | 00000000 | 00000000 |
| 1 | 0 | 00 | 10000000 | 01111111 | 00000001 | 00000000 | 00000000 |
| 1 | 0 | 00 | 11000000 | 00111111 | 00000011 | 00000000 | 00000000 |
| 1 | 0 | 00 | 11100000 | 00011111 | 00000111 | 00000000 | 00000000 |
| 1 | 0 | 00 | 11110000 | 00001111 | 00001111 | 00000000 | 00000000 |
| 1 | 0 | 00 | 11111000 | 00000111 | 00011111 | 00000000 | 00000000 |
| 1 | 0 | 00 | 11111100 | 00000011 | 00111111 | 00000000 | 00000000 |
| 1 | 0 | 00 | 11111110 | 00000001 | 01111111 | 00000000 | 00000000 |
| 1 | 0 | 00 | 11111111 | 00000000 | 11111111 | 00000000 | 00000000 |
| 1 | 0 | 01 | 11111110 | 00000000 | 01111111 | 00000001 | 00000000 |
| 1 | 0 | 01 | 11111100 | 00000000 | 00111111 | 00000011 | 00000000 |
| 1 | 0 | 01 | 11111000 | 00000000 | 00011111 | 00000111 | 00000000 |
| 1 | 0 | 01 | 11110000 | 00000000 | 00001111 | 00001111 | 00000000 |
| 1 | 0 | 01 | 11100000 | 00000000 | 00000111 | 00011111 | 00000000 |
| 1 | 0 | 01 | 11000000 | 00000000 | 00000011 | 00111111 | 00000000 |
| 1 | 0 | 01 | 10000000 | 00000000 | 00000001 | 01111111 | 00000000 |
| 1 | 0 | 01 | 00000000 | 00000000 | 00000000 | 11111111 | 00000000 |
| 1 | 0 | 11 | 10000000 | 00000000 | 00000000 | 01111111 | 00000001 |
| 1 | 0 | 11 | 11000000 | 00000000 | 00000000 | 00111111 | 00000011 |
| 1 | 0 | 11 | 11100000 | 00000000 | 00000000 | 00011111 | 00000111 |
| 1 | 1 | 11 | 11100000 | 00000000 | 00000000 | 00011111 | 00000111 |
| 0 | 1 | 11 | 11000000 | 00000000 | 00000000 | 00111111 | 00000011 |
| 0 | 1 | 11 | 10000000 | 00000000 | 00000000 | 01111111 | 00000001 |
| 0 | 1 | 11 | 00000000 | 00000000 | 00000000 | 11111111 | 00000000 |
| 0 | 1 | 01 | 10000000 | 00000000 | 00000001 | 01111111 | 00000000 |
| 0 | 1 | 01 | 11000000 | 00000000 | 00000011 | 00111111 | 00000000 |

FIG. 10

CLOCK RECOVERY CIRCUIT

FIELD OF THE INVENTION

The present invention relates to a clock recovery circuit that can be used for recovering a clock signal from a data stream having a high data rate. More particularly, a clock recovery circuit that is capable of using a single voltage controlled oscillator (VCO), phase interpolation, and digital filtering to recover, with low jitter, a clock signal from a source of unknown relative phase being transmitted at high clock rates. The present invention operates with a VCO having a small number of stages, but obtains high phase resolution, and is able to perform a clock and data recovery function through use of a local clock reference and a single VCO, and thus avoid frequency locking that can occur with use of multiple VCOs.

BACKGROUND OF THE RELATED ART

In order to save costs, such as wiring or interconnection costs, it is desirable to transmit digital data between remote sites in a serial manner. This allows a single optical fiber or wire (for example, coaxial or twisted-pair) to carry a serial stream of data bits. One such system of transmitting data is know as Fibre Channel. Two standards that have been implemented for Fibre Channel are the American National Standards Institute (ANSI) standard and the Gigabit Ethernet standard. The ANSI standard uses a frequency of 1.0625 GHz. The Gigabit Ethernet standard, however, uses a frequency of 1.25 GHz.

In order to further reduce costs, the clock data needed by a remote receiver to reclock the serial bit stream is often encoded with other data. The circuitry by which the clock data is recovered from the data stream is often called a clock recovery circuit. In some applications, it is desirable to recover the clock data and then reclock the data and send it serially to another location. The reclocking process reduces timing jitter on the encoded data, which typically results from transmitting serial data at high frequencies over various media. Reduction of jitter makes it possible for the clock recovery circuitry positioned downstream in the system to recover the data with a smaller probability of error. Thus, clock recovery is an important feature in digital communications.

Quite often it is desirable for a circuit to be able to convert parallel data into serial data and transmit the serial data via a transmission media using its own reference frequency. It is also advantageous to be able to receive data at the same time from a source that is not synchronized with a local source. The problem encountered when both functions need to be performed in the same circuit is that two frequencies that are close to each other—often within a few parts per million—must be generated.

If both clocks are to be generated using different circuitry, two VCOs running at nearly the same frequency are likely to be used. These two VCOs would be controlled by two different phase locked loops. An arrangement for generating these town frequencies is shown in FIGS. 1A and 1B.

As seen in FIG. 1A, a phase locked loop generates and independent transmit frequency (i.e., Transmit Clock) using a crystal or externally supplied reference clock. The reference frequency produced by the crystal or externally supplied reference clock is normally at a much lower frequency than the VCO frequency. For example, if the ANSI standard is used, the transmission frequency needs to be 1.0625 GHz an if the Gigabit Ethernet standard is used, the transmission frequency needs to be 1.25 GHz. The crystal or externally supplied reference clock, however, would have a frequency of 21.25 MHz if the ANSI standard were used and 25 MHz if the Gigabit Ethernet standard were used.

In the phase locked loop shown in FIG. 1A, the reference frequency produced by the crystal or externally supplied reference clock is compared via phase/frequency detector 102 to a divided down version of the much higher frequency generated VCO 106. The VCO frequency is divided down to an appropriate level via frequency divider 108. If a 25 MHz reference frequency is used in a Gigabit Ethernet system operating at 1.25 GHz, frequency divider 108 would have to divide the VCO frequency by 50.

Phase/frequency detector 102 compares the phases of the two low frequencies. The output of phase/frequency detector 12 drives loop filter 104, which includes a charge pump. The output of loop filter 104 controls VCO 106 thereby generating the correct transmit clock frequency.

As seen in FIG. 1B, the frequency for reclocking and data detection can be generated in a similar manner. In this feedback loop, however, the reference frequency can be extracted from the data stream or from the crystal or externally supplied reference clock. One was to achieve this extraction is to compare the data stream with the frequency produced by VCO 116.

To initially acquire a frequency, the VCO first locks to the externally supplied reference frequency generated by the crystal or externally supplied reference clock—much in the same was as discussed above with respect to FIG 1A. After the frequency of VCO 116 is close to the externally supplied reference frequency, multiplexer 110 causes the phase locked loop to switch over and begin using the data as the reference frequency instead of the crystal or the externally supplied reference clock. Once at the appropriate frequency, the output of VCO 116 is used to reclock the data via flip flop 120.

There are problems that are often encountered when using the foregoing approach. For example, injection locking of VCOs 106 and 116 can occur. This is caused by noise coupling between VCOs 106 and 116 through the power supply and ground lines or through the substrate. More particularly, injection locking means that while the two frequencies produced by VCOs 106 and 116 are suppose to slowly shift past each other in phase, at some point in the phase relationship, the two phases tend to lock together for a short while and then slip apart thereby causing excessive jitter.

In order to overcome this problem a hybrid approach such as the one shown in FIG. 2 has been used. In this design, analog and digital techniques have been combined and only one VCO 202 is required. The asynchronous data recovery clock is generated by first locking VCO 202 to an external crystal or other reference frequency. In the implementation shown in FIG. 2, VCO 202 is implemented in such a way as to have available, simultaneously, multiple phases. For example, VCO 202 can be a voltage controlled ring oscillator with 5 differential stages thereby producing 10 different phases simultaneously. The recovered clock frequency is selected from one of the 10 phases by multiplexer 206. The selected recovered clock frequency and the data stream are compared in up/down detector 208. A phase higher or lower then the presently selected phase is selected in accordance with an "up" or a "down" signal generated by up/down detector 208 after filtering is performed by digital loop filter 210.

In digital loop filter 210, the up and down pulses are used to shift a single bit back and forth in a high speed left/right shift register. When the bit reaches one end of the shift register, the next phase of ring oscillator 202 is selected by multiplexer 206.

The problem with the forgoing design is that the recovered clock phase is limited to being one of the few phases generated by VCO 202. In order to ensure a low amount of jitter, the differences between the phases generated by VCO 202 must be small. Thus, this design requires a VCO with numerous stages so as to generate small phase steps. In other words, the more stages the VCO has the smaller the steps are between stages. At high frequencies, however, it is difficult to generate a ring oscillators with a large number of stages. For example, if a frequency of 1.0625 GHz with 32 different phase selections were desired, the ring oscillator would have to contain 16 stages with each stage having a propagation delay of only 58.8 ps (i.e., (1/1.0625 GHz)/16). In addition, the 16 outputs from the ring oscillator would have to be routed to multiplexer 206, which would have to be able to switch between these outputs without adversely affecting the clock frequency. Further, the routing of the output lines and the multiplexing would have to maintain the 58.8 ps timing resolution. These high speed requirements would require a large amount of power dissipation and are incompatible with current commercial semiconductor processes.

SUMMARY OF THE INVENTION

It is, therefore, an object of the present invention to provide a clock recovery circuit that has low power requirements.

It is another object of the present invention to provide a sufficiently large number of phase resolutions.

It is further object of the present invention to prevent injection locking.

It is also another object of the present invention to recover a clock frequency with low noise and jitter.

It is also a further object of the present invention to operate using a single VCO with a small number of stages.

It is another object of the present invention to generate and track a data recovery clock at very high frequencies without the need for two analog phase locked loops.

It is a further object of the present invention to minimize latency (clock delays) through the circuit.

In order to attain the above objects of the present invention, among others, the present invention provides a phase interpolator and digital loop filtering. The use of a phase interpolator enables the use of a single VCO having a small number of stages. The digital loop filter reduces the power consumption and provides immunity to substrate noise coupling.

BRIEF DESCRIPTION OF THE DRAWINGS

These and other objects, features, and advantages of the present invention are better understood by reading the following detailed description of a preferred embodiment, taken in conjunction with the accompanying drawings, in which:

FIG. 10 is a table showing the operation of the DAC control logic depicted in FIG. 9.

DETAILED DESCRIPTION OF A PREFERRED EMBODIMENT

Figure 1A:
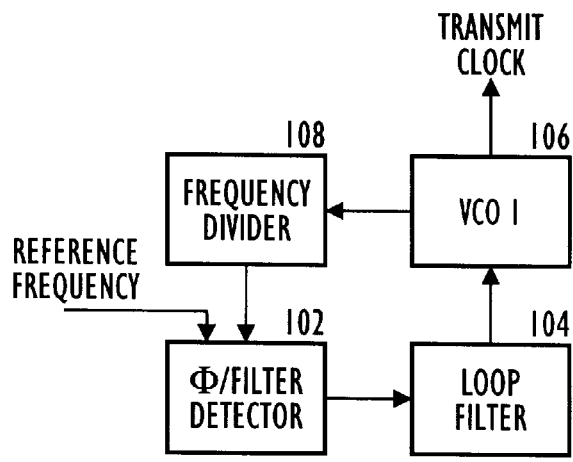
FIG. 1A illustrates a prior art transmit clock generator.
Figure 1B:
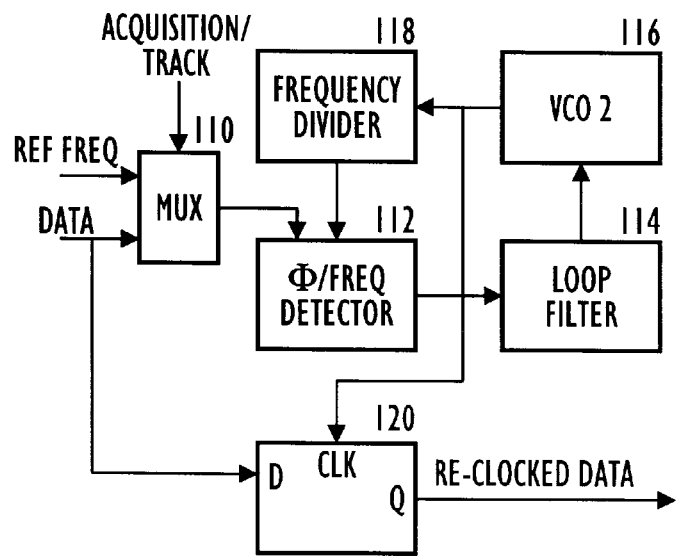
FIG. 1B illustrates a prior art clock recovery circuit.
Figure 2:
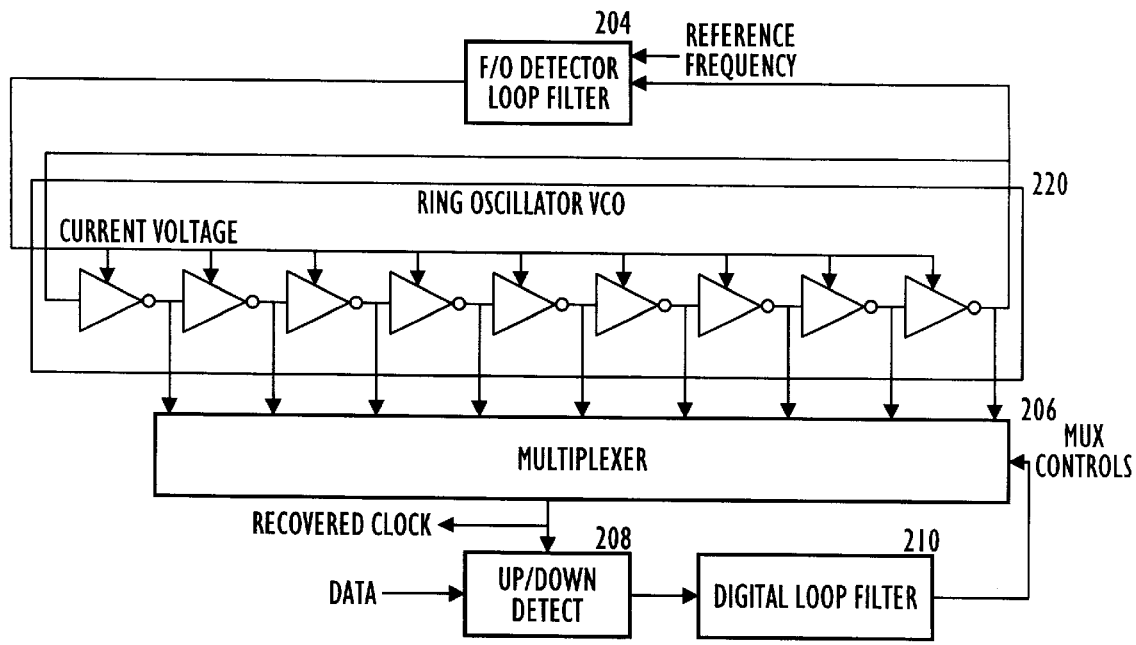
FIG. 2 illustrates another prior art clock recovery circuit.
Figure 3:
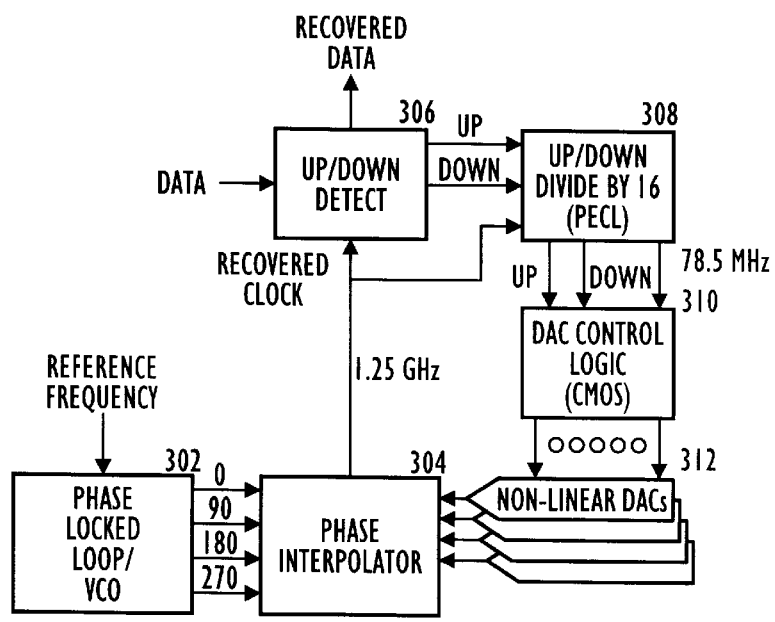
FIG. 3 illustrates a clock recovery circuit according to the present invention.
Figure 4:
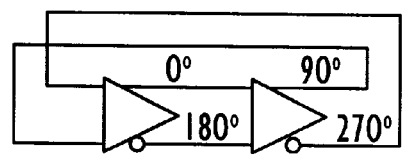
FIG. 4 is a more detailed diagram of the VCO depicted in FIG. 3.

In the embodiment of the present invention shown in FIG. 3, VCO 302 contains a small number of stages. In this embodiment, a two stage differential ring oscillator, such as the one shown in FIG. 4, has been chosen for VCO 302. The two stages, with complimentary outputs, generate four phases, each separated by 90° (i.e., 0°, 90°, 180°, and 270°). The phases produced by VCO 302 are supplied to phase interpolator 304, which interpolates, in accordance with digital to analog converters (DACs) 312, between the four inputs. DACs 312 have nonlinear transfer functions. DACs 312 are designed to be nonlinear in order to maintain uniform phase and amplitude step accuracy throughout the range of interpolation required.

Figure 5:
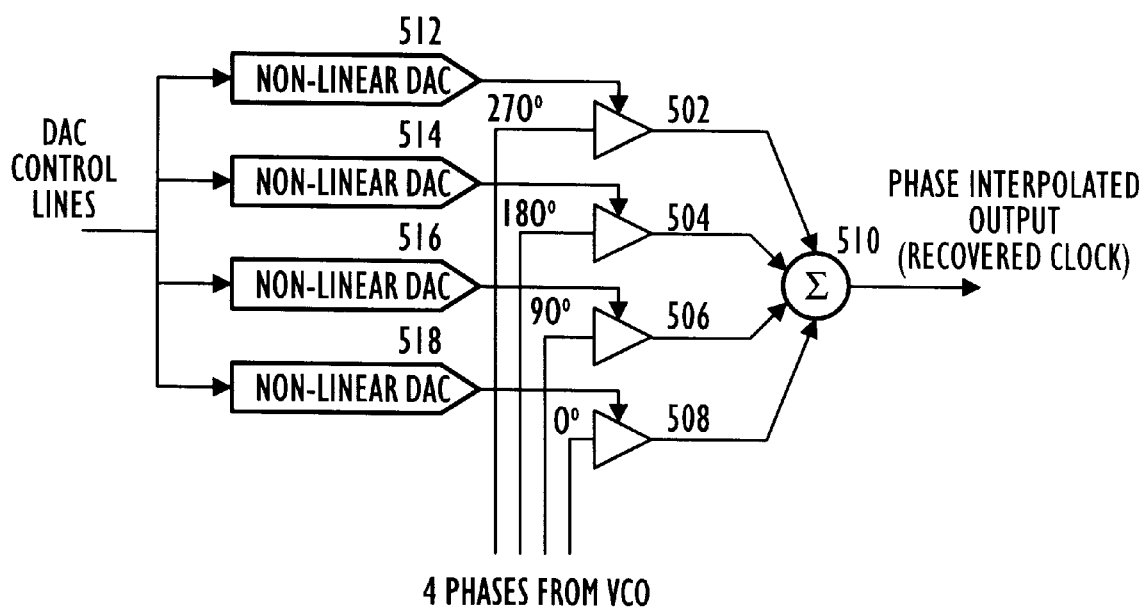
FIG. 5 is a more detailed diagram of the phase interpolator and the digital to analog converters (DACs) depicted in FIG. 3.
Figure 6:
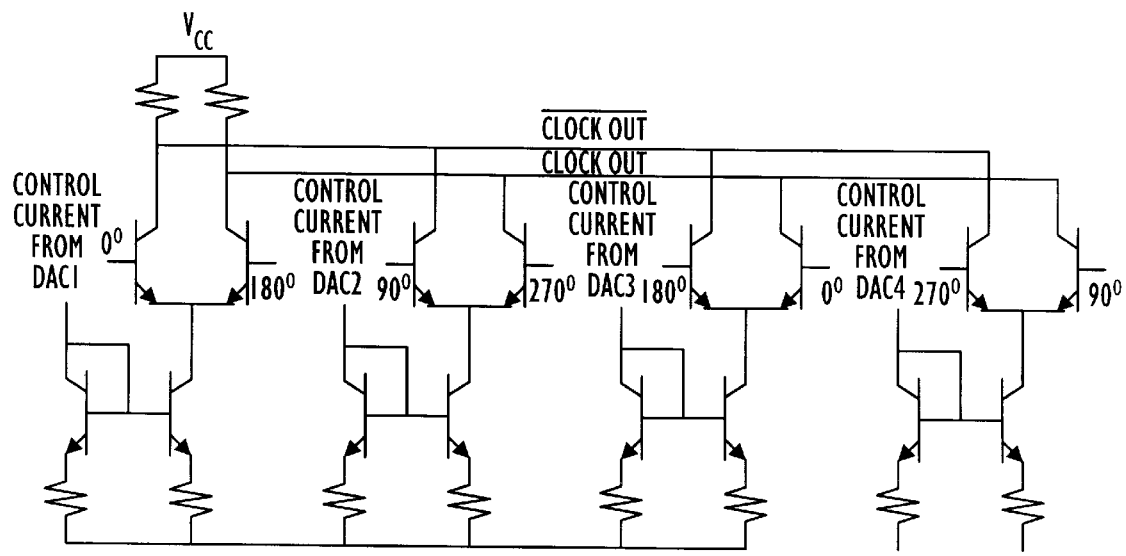
FIG. 6 is a transistor level diagram of the phase interpolator depicted in FIG. 3.

FIG. 5 shows how DACs 312 can be used by phase interpolator 304. In this embodiment the four stages produced by VCO 302 are each amplified by a corresponding amplifier 502, 504, 506, and 508. The amplified stages are then summed together via adder 510. The gain of each amplifier 502, 504, 506, and 508 is controlled by a corresponding one of the DACs 512, 514, 516, and 518. Accordingly, DACs 512, 514, 516, and 518 control the weighing factor given to each of the four phases produced by VCO 302. One embodiment of a phase interpolator that performs this type of operation is shown in FIG. 6.

The following describes how different phases can be generated using the above described design. If 0° is desired, DAC 518 is set to its maximum level (for example, 1*fullscale) and DACs 512, 514, and 516 are set to their minimum level (for example, 0*fullscale). The transfer function of DACs 512, 514, 516, and 518 is sinusoidal in nature so that for each successive state, the amplitude and phase of the interpolated output is correct. Thus, if 45° is desired, DACs 516 and 518 are set to their mid-levels (for example, 0.707*fullscale) and DACs 512 and 514 are set to their minimum levels. More generally, if a phase $\Theta$, between 0° and 90° is desired, the value of DAC 518 is set to $(\Theta/90)*COS(\Theta)$ and DAC 516 is set to $(\Theta/90)*SIN(\Theta)$. The DACs 512, 514, 516, and 518 and amplifiers 502, 504, 506, and 508 come into play as the desired phase increases from 90° to 360°. Thus, with the above described device, a high frequency clock can be generated with phases that are digitally controlled in very fine increments. If the four DACs 512, 514, 516, and 518 are used, 32 different phase states can be obtained using 3 control bits per DAC.

The output of phase interpolator 304 is supplied to up/down detector 306, which compares the data with the output of phase interpolator 304 and generates "up" and "down" commands at each data transition. An embodiment of up/down detector 306 is shown in FIGS. 7A–7B.

Figure 7A:
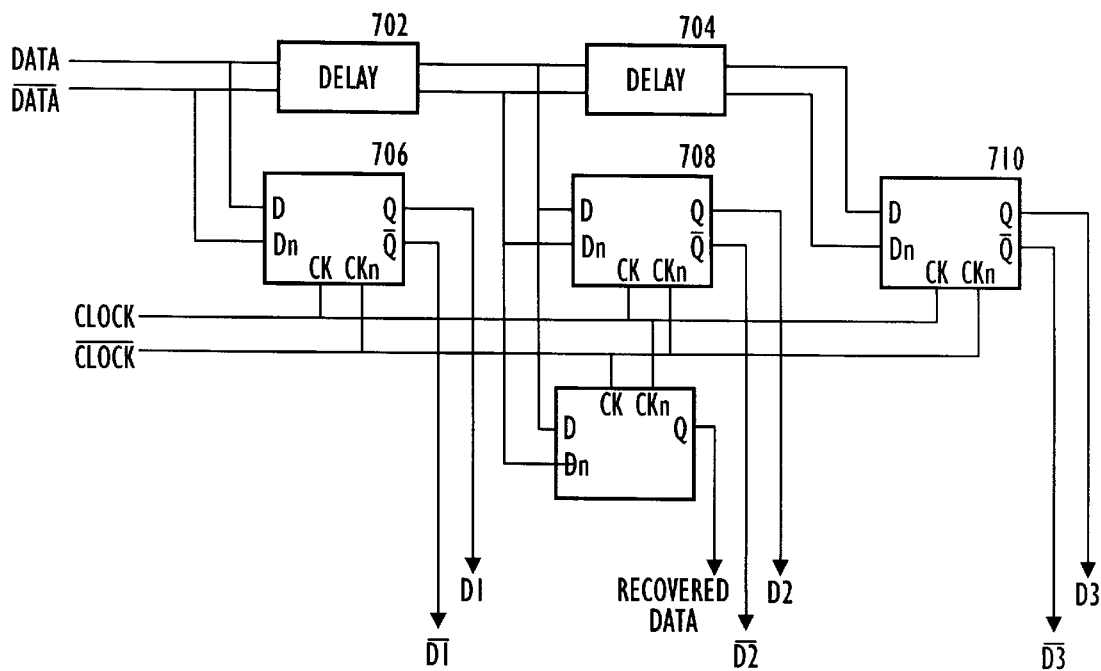
FIGS. 7A–7B is a more detailed diagram of the up/down detector depicted in FIG. 3.
Figure 7B:
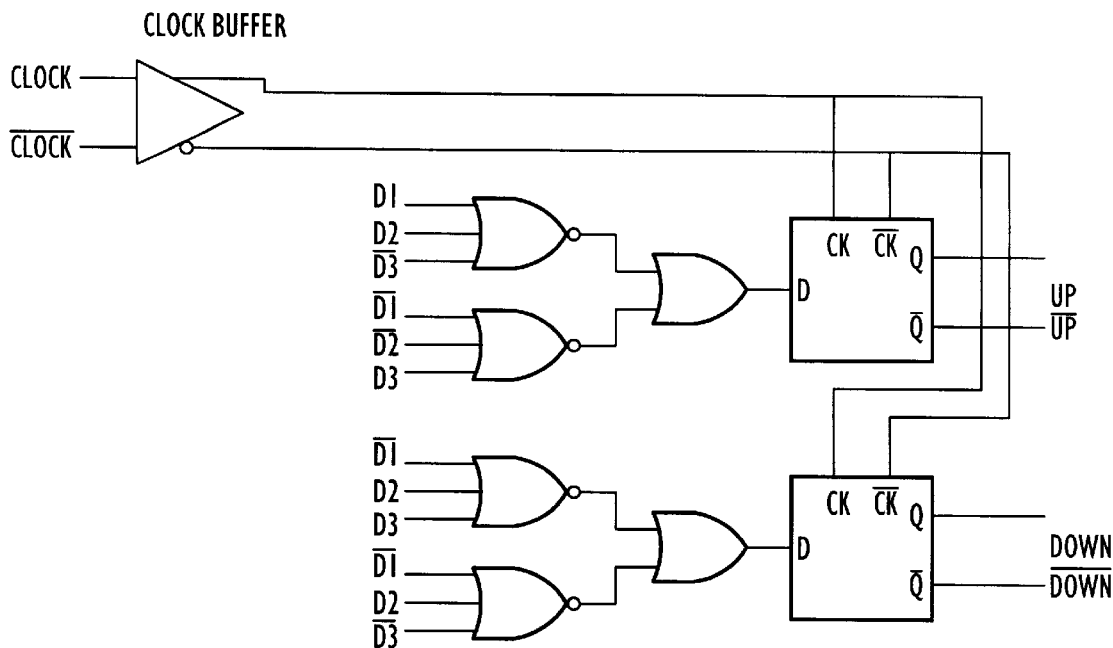

The portion of up/down detector 306 shown in FIG. 7A uses delay elements 702 and 704 to delay the input data. The original data and its two delayed versions are clocked, via flip flops 706, 708, and 710 with the output of phase interpolator 304. The output of flip flops 706, 708, and 710 are supplied to the combinatorial logic shown in FIG. 7B. This logic is designed so that if D1=D2=D3 neither an up nor a down pulse is produced, thereby indicating that the phase of the output from phase interpolator 304 does not have to be advanced or retarded. If, however, D1=D2 <>D3, an up pulse is produced indicating that phase interpolator 304 needs to advance the phase of it output. Finally, if D1<>D2=D3, a down pulse is produced indicating that phase interpolator 304 needs to retard the phase of its output. Via this circuit, up and down pulses are generated with each data edge transition and the feedback loop of the circuit attempts to align the recovered clock with the data transitions.

Figure 7C:
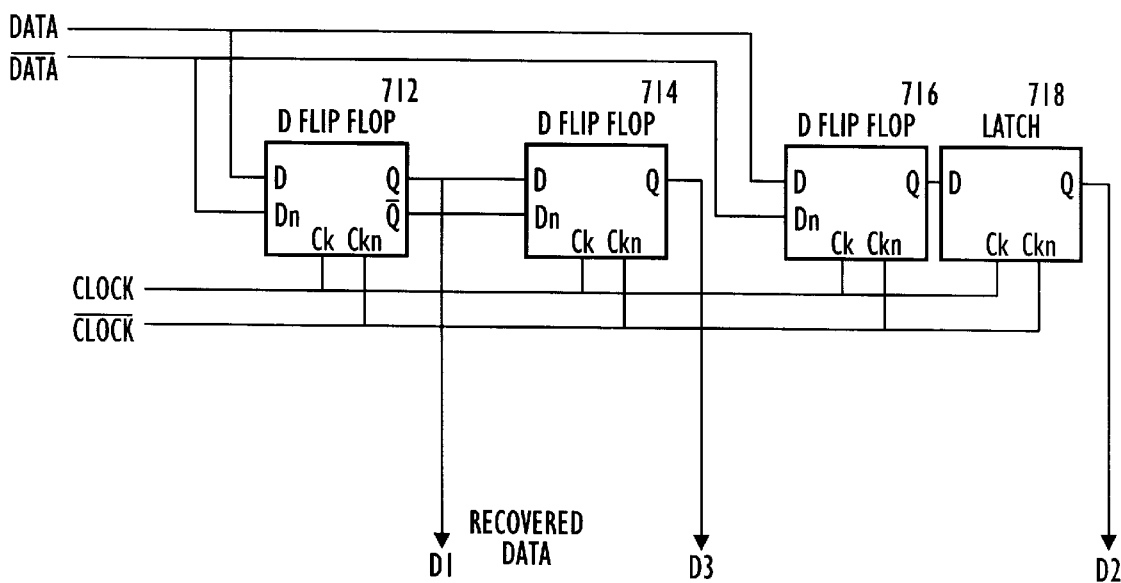
FIG. 7C is an alternative embodiment of the circuit depicted in FIG. 7A.

An alternative to the circuit depicted in FIG. 7A is depicted in FIG. 7C. The portion of up/down detector 306 shown in FIG. 7C uses flip flops 712, 714, and 716 and a latch 718. In this embodiment, the original data is clocked via flip flops 712 and 716. Latch 718 causes a first delay in the output, which is signal line D2. The outputs of flip flop 712 are provided to flip flop 714. This arrangement causes a delay between the production of the clocked data on line D1 and the clocked data on line D3. Thus, in this embodiment, the analog delays 702 and 704 are not needed.

Figure 8A:
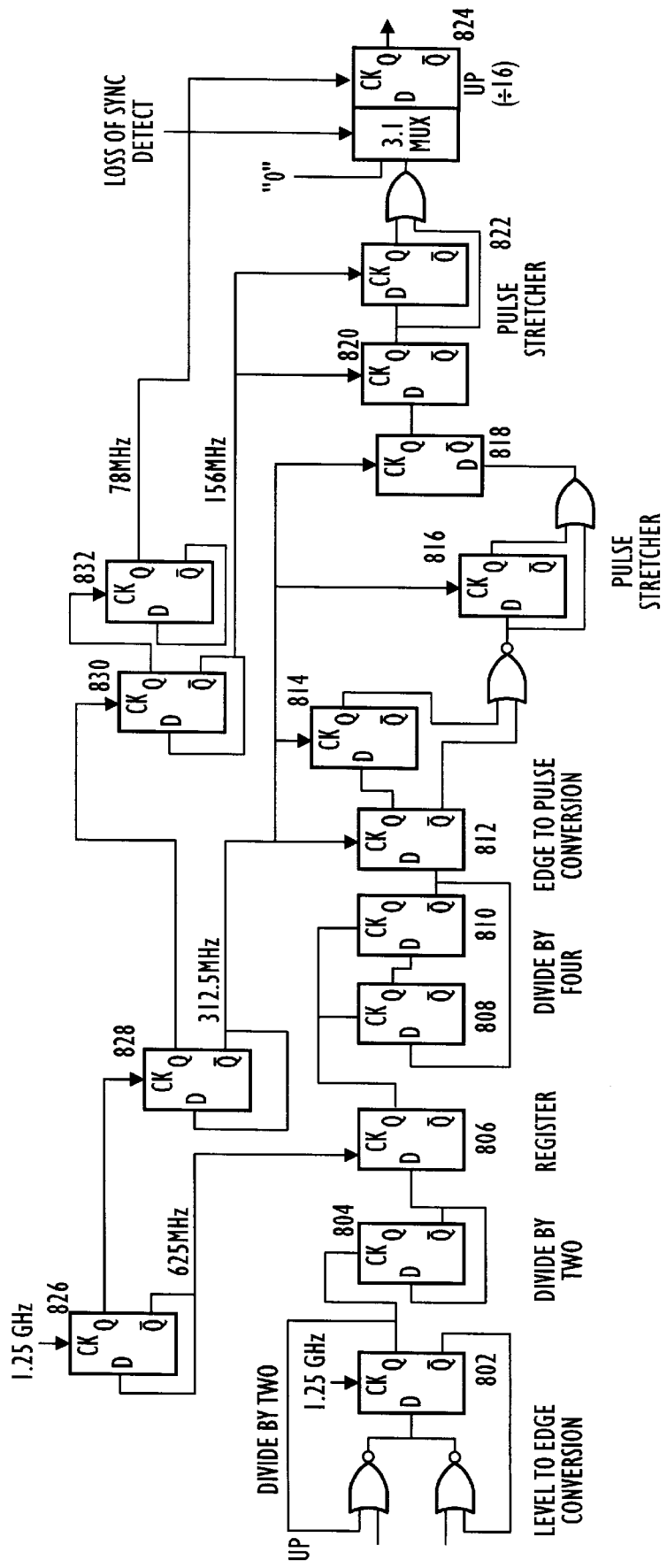
FIGS. 8A–8B is a more detailed diagram of the up/down filter depicted in FIG. 3.
Figure 8B:
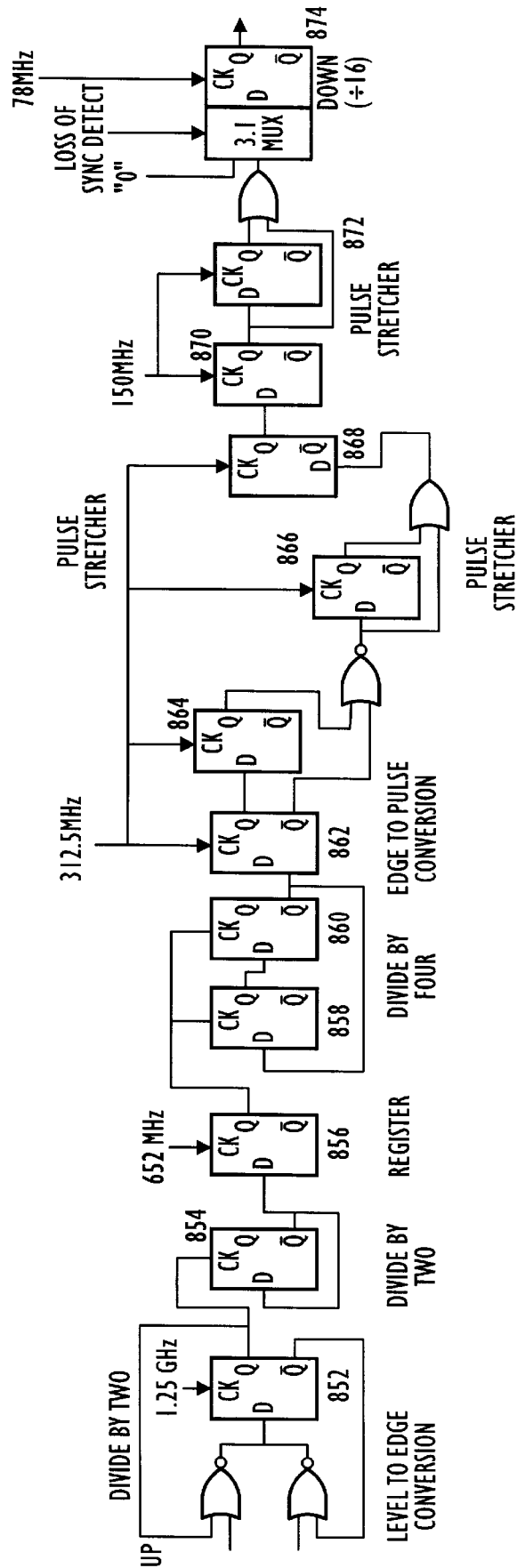

The high speed up and down pulses produced by up/down detector 306 are provided to up/down filter 308. One embodiment of such filter is shown in FIGS. 8A–8B. Up/down filter 308 converts the high speed up and down pulses, which are synchronous with the output of phase interpolator 304, to low speed up and down commands, which are synchronous with the output of phase interpolator 304 divided by an integer (16 in the example shown in FIGS. 8A–8B). In order to perform this function and at the same time minimize power, the output of phase interpolator 304 is divided down by the ripple counters shown in FIGS. 8A and 8B.

In FIGS. 8A–8B, the up and down pulses are converted to edges via flip flops 802 and 852. In FIGS. 8A–8B, the flip flops of the ripple counters that act on the up and down pulses (i.e., flip flops 802, 804, 806, 808, 810, 812, 814, 816, 818, 820, 822, 824, 852, 854, 856, 858, 860, 862, 864, 866, 868, 870, 872, and 874) have delays that match the flip flops of the ripple counter that delays the output of phase interpolator 304 (i.e., flip flops 826, 828, 830, and 832).

In sum, in up/down filter 308, the high speed up and down pulses are converted to edges and the frequency thereof is divided down by 16 (i.e., two divide by 2s and a divide by four). The low power approach shown in FIGS. 8A–8B allows for each individual flip flop to run at the minimum power level possible since each stage down the ripple counter runs slower than the stage before. Once the up and down pulses have been reduced to a lower data rate, CMOS logic can be used. Thus, DAC Control Logic 310, which generates the commands for DACs 312, can be designed from low speed CMOS circuitry.

Figure 9:
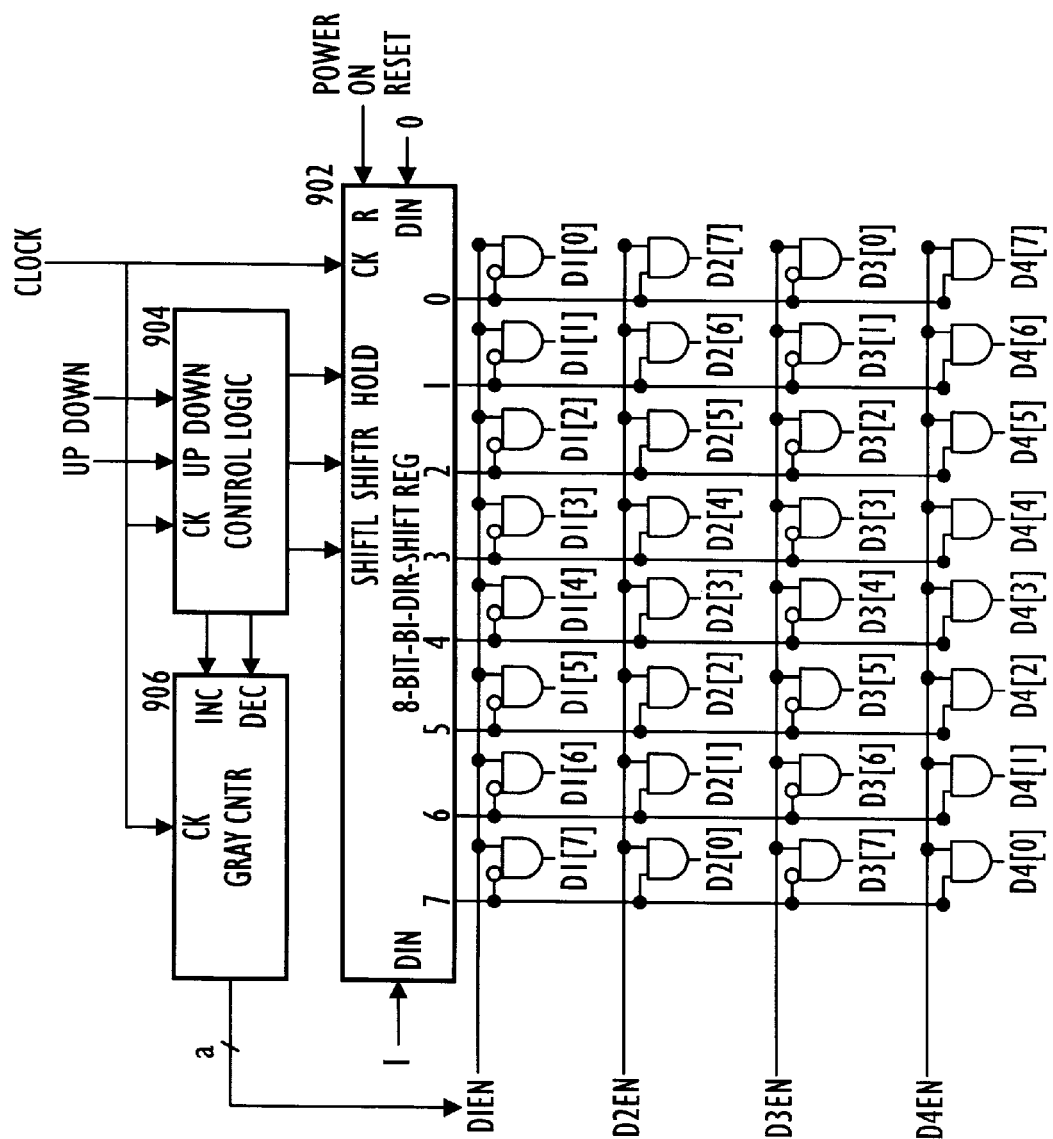
FIG. 9 is a more detailed diagram of the DAC control logic depicted in FIG. 3.

As shown in FIG. 9, DAC control logic 310 has a bi-directional shift register 902. Shift register 902 is designed to shifts logical 1s in from the left and logical 0s in from the right. On power up, shift register 902 can be cleared via a power on reset. When an "up" signal is received from up/down filter 308, shift register 902 shifts left until each bit is a one. At this time, for each additional "up" signal, shift register 902 will reverse direction and start shifting 0s in from the right until each bit is a zero. Once all eight bits are zero, shift register 902 will once again reverse direction and shift 1s in from the left. This "ping-pong" like action is reversed if a "down" signal, but no up signal, is received from up/down filter 308. If both an "up" and a "down" signal are received from up/down filter 308, shift register 902 holds its current state. Control logic 904 is used to keep track of which direction the bits in shift register 902 are moving. Gray code counter 906 keeps track of which of the four quadrants phase interpolator 304 is in by incrementing or decrementing a counter. An advantage of this approach is that it inherently will recover from a condition that puts the shift register in an invalid state.

The outputs of shift register 902 are used to control the DACs 312. In the above described embodiment, only two of the four DACs 312 are enabled since for any given phase state it is only necessary to interpolate between two adjacent phases. Further, the outputs of shift register 902 are inverted before being supplied to the two enable DACs 312.

DACs 312 are fully segmented in that each advance in the input code turns on an additional current source, rather than having to convert from binary to "thermometer" code in order to drive the fully segmented DACs 312. DAC control logic 310 directly outputs a thermometer code. Therefore, each three bit DAC has 8 inputs which control 8 current sources. Gray code counter 906 keeps track of which quadrant the phase interpolator should be in and, depending on its output, enables or disables the inputs to the appropriate DACs 312. To help illustrate how DAC control logic 310 operates, a logic table is presented in FIG. 10. The first line of the table shows an up signal, a DAC select signal (DSEL) which select the two DACs 312 that are associated with the 0° and the 90° phases of VCO 302, shift register 902 contains all zeros, the DAC 312 associated with the 0° phase of VCO 302 has all 8 current sources active, and the DACs 312 associated with all of the other phases have no active current sources.

The high order bit of DSEL selects between the DACs 312 that is associated with the 90° and the 270° phases of VCO 302. For example, a zero in the high order bit of DSEL selects the DAC 312 that is associated with the 90° phase of VCO 302 and a one in the high order bit of DSEL selects the DAC 312 that is associated with the 270° phase of VCO 302. The low order bit of DSEL is utilized in the same manner. In particular, a zero in the low order bit of DSEL selects the DAC 312 that is associated with the 0° phase of VCO 302 and a one in the low order bit of DSEL selects the DAC 312 that is associated with the 180° phase of VCO 302.

As seen in the second line of the table in FIG. 10, because an up signal has been received, shift register 902 sifts in one from the left (SREG). As seen in the first line of the table, all of the current sources of the DAC 312 that is associated with the 0° phase of VCO 302 (DAC1) are active. Therefore, when the up signal is received in line two of the table, one of the current sources of the DAC 312 that is associated with of the 0° phase of VCO 302 goes inactive and a current source of the DAC 312 that is associated with the 90° phase of VCO 302 (DAC2) goes active. This type of turning on and off current sources occurs until all of the current sources of the DAC 312 that is associated with the 0° phase of VCO 302 go inactive and all of the current sources of the DAC 312 that is associated with the 90° phase of VCO 302 go active. This occurs in line 9 of the table. As seen in line 10 of the table, another up signal causes one of the current sources of the DAC 312 that is associated with the 90° phase of VCO 302 (DAC3) to go active.

As seen by comparing line 20 and 21 of the table, when both an up and a down signal are received, no change in shift register 902 occurs, nor do any changes in the current sources occur. As seen in line 22 of the table, when a down signal is received, one of the current sources of the DAC 312 that is associated with the 270° phase of VCO 302 goes inactive and a current source of the DAC 312 that is associated with the 180° phase of VCO 302 (DAC3) goes active.

While the preferred embodiment and details of the invention have been described above, it will be apparent to those skilled in the art that various changes and modifications may be made without departing from the scope of the invention, as defined by the claims below.

We claim:

1. A clock recover circuit comprising:
    a voltage controlled oscillator constructed to generate, in accordance with a reference frequency, a plurality of clock signals, each of the plurality of clock signals having a different phase and the plurality of clock signals having a common frequency;
    a phase interpolator constructed to generate a recovered clock signal having the common frequency and a selected phase, the selected phase being interpolated from at least two of the plurality of clock signals; and
    means for causing the selected phase of the recovered clock signal to be advanced when the selected phase of the recovered clock signal is behind a phase of a data signal and for causing the selected phase of the recovered clock signal to be hindered when the selected phase of the recovered clock signal is ahead of the phase of the data signal, the means including:
        a plurality of non-linear digital to analog converters that are constructed to cause the phase interpolator to change the selected phase of the recovered clock signal.

2. A clock recovery circuit according to claim 1, wherein a transfer function of each non-linear digital to analog converter is sinusoidal.

3. A clock recovery circuit according to claim 1, wherein the means further includes a CMOS logic constructed to control the plurality of non-linear digital to analog converters.

4. A clock recovery circuit according to claim 1, wherein the voltage controlled oscillator is a two-stage ring oscillator.

5. A clock recovery circuit according to claim 1, wherein each non-linear digital to analog converter includes a plurality of current sources and wherein the means cause the selected phase of the recovered clock signal to be one of advanced and hindered by one of activating and deactivating a selected one of the current sources.

6. A clock recovery circuit according to claim 1, wherein the frequency of the recovered clock signal is one of 1.0625 MHz and 1.25 MHz.

7. A clock recovery circuit according to claim 1, wherein the phases of the plurality of clock signals include 0°, 90°, 180°, and 270°.

8. A clock recovery circuit according to claim 7, wherein the phase interpolator uses:
    the clock signals having the 0° and 90° phases to interpolator phases of the recovered clock signal between 0° and 90° inclusive,
    the clock signals having the 90° and 180° phases to interpolate phases of the recovered clock signal between 90° and 180° inclusive,
    the clock signals having the 180° and 270° phases to interpolate phases of the recovered clock signal between 180° and 270° inclusive,
    the clock signals having the 270° and 0° phases to interpolate phases of the recovered clock signal between 270° and 0° inclusive.

9. A clock recovery circuit comprising:
    means for generating, in accordance with a reference frequency, a recovered clock signal having a selected phase;
    an up/down detector constructed to produce a first pulse when the selected phase of the recovered clock signal is ahead of a phase of a data signal, and to produce a second pulse when the selected phase of the recovered clock signal is behind the phase of the data signal;
    a divider constructed to divide the number of first pulses, the number of second pulses, and the frequency of the recovered clock signal by a predetermined number and output the results thereof; and
    control logic constructed to cause, in accordance with the output of the divider, the means for generating the recovered clock signal to change the selected phase of the recovered clock signal.

10. A clock recovery circuit according to claim 9, wherein the control logic includes CMOS logic.

11. A clock recovery circuit according to claim 9, wherein the predetermined number is at least 16.

12. A clock recovery circuit according to claim 9, wherein the frequency of the recovered clock signal is one of 1.0625 MHz and 1.25 MHz.

13. A clock recovery circuit according to claim 12, wherein the predetermined number is 16.

14. A clock recover circuit comprising:
    a voltage controlled oscillator constructed to produce, in accordance with a reference frequency, a plurality of clock signals, each of the plurality of clock signals having a different phase and the plurality of clock signals having a common frequency;
    a plurality of non-linear digital to analog converters;
    a phase interpolator constructed to generate a recovered clock signal having the common frequency and a selected phase, the selected phase being interpolated from at least two of the plurality of clock signals in accordance with outputs from the non-linear digital to analog converters;
    an up/down detector constructed to produce a first pulse when the selected phase of the recovered clock signal is ahead of a phase of a data signal, and to produce a second pulse when the selected phase of the recovered clock signal is behind the phase of the data signal;
    a divider constructed to divide the number of first pulses, the number of second pulses, and the frequency of the recovered clock signal by a predetermined number and to output the results thereof; and
    control logic constructed to control, in accordance with the output of the divider, the plurality of non-linear digital to analog converters.

15. A clock recovery circuit according to claim 14, wherein a transfer function of each non-linear digital to analog converter is sinusoidal.

16. A clock recovery circuit according to claim 14, wherein the control logic includes CMOS logic.

17. A clock recovery circuit according to claim 14, wherein the voltage controlled oscillator is a two-stage ring oscillator.

18. A clock recovery circuit according to claim 14, wherein each non-linear digital to analog converter includes a plurality of current sources and wherein the control logic cause the plurality of non-linear digital to analog converters to one of advance and hinder the selected phase of the recovered clock signal by one of activating and deactivating a selected one of the current sources.

19. A clock recovery circuit according to claim 14, wherein the frequency of the recovered clock signal is one of 1.0625 MHz and 1.25 MHz.

20. A clock recover circuit according to claim 19, wherein the predetermined number is 16.

21. A clock recovery circuit according to claim 14, wherein the phases of the plurality of clock signals include 0°, 90°, 180°, and 270°.

22. A clock recovery circuit according to claim 21, wherein the phase interpolator uses:

the clock signals having the 0° and 90° phases to interpolate phases of the recovered clock signal between 0° and 90° inclusive, the clock signals having the 90° and 180° phases to interpolate phases of the recovered clock signal between 90° and 180° inclusive, the clock signals having the 180° and 270° phases to interpolate phases of the recovered clock signal between 180° and 270° inclusive, the clock signals having the 270° and 0° phases to interpolate phases of the recovered clock signal between 270° and 0° inclusive.

23. A clock recovery circuit according to claim 14, wherein the predetermined number is at least 16.

24. A clock recovery circuit comprising:

a voltage controlled oscillator constructed to produce, in accordance with a reference frequency, a first clock signal having a phase of 0°, a second clock signal having a phase of 90°, a third clock signal having a phase of 180°, and a fourth clock signal having a phase of 270°, wherein the first, second, third, and fourth clock signals having a common frequency;

four non-linear digital to analog converters;

a phase interpolator constructed to generate, in accordance with outputs from the non-linear digital to analog converters, a recovered clock signal having the common frequency and a selected phase, the selected phase being interpolated from one of the first and second clock signals, the second and third clock signals, the third and fourth clock signals, and the fourth and first clock signals;

an up/down detector constructed to produce a first pulse when the selected phase of the recovered clock signal is ahead of a phase of a data signal, and to produce a second pulse when the selected phase of the recovered clock signal is behind the phase of the data signal;

a divider constructed to divide the number of first pulses, the number of second pulses, and the frequency of the recovered clock signal by a predetermined number and output the results thereof; and control logic constructed to control, in accordance with the output of the divider, the plurality of non-linear digital to analog converters.

25. A clock recovery circuit according to claim 24, wherein a transfer function of each non-linear digital to analog converter is sinusoidal.

26. A clock recovery circuit according to claim 24, wherein the predetermined number is large enough to reduce the frequency of the recovered clock signal so that the control logic can include CMOS logic.

27. A clock recovery circuit according to claim 24, wherein the voltage controlled oscillator is a two-stage ring oscillator.

28. A clock recovery circuit according to claim 24, wherein each non-linear digital to analog converter includes a plurality of current sources and wherein the control logic cause the plurality of non-linear digital to analog converters to one of advance and hinder the selected phase of the recovered clock signal by one of activating and deactivating a selected one of the current sources.

29. A clock recovery circuit according to claim 24, wherein the frequency of the recovered clock signal is one of 1.0625 MHz and 1.25 MHz.

30. A clock recovery circuit according to claim 29, wherein the predetermined number is 16.

31. A clock recovery circuit according to claim 24, wherein the predetermined number is at least 16.

* * * * *